(12) United States Patent
Xiong et al.

(10) Patent No.: US 11,973,516 B2
(45) Date of Patent: Apr. 30, 2024

(54) SOFT DECODING CORRECTABLE PAGE ASSISTED LLR ESTIMATION

(71) Applicant: Innogrit Technologies Co., Ltd., Shanghai (CN)

(72) Inventors: Chenrong Xiong, San Jose, CA (US); Jie Chen, Shanghai (CN)

(73) Assignee: Innogrit Technologies Co., Ltd., Shanghai (CN)

(*) Notice: Subject to any disclaimer, the term of this patent is extended or adjusted under 35 U.S.C. 154(b) by 0 days.

(21) Appl. No.: 17/858,408

(22) Filed: Jul. 6, 2022

(65) Prior Publication Data
US 2024/0014830 A1    Jan. 11, 2024

(51) Int. Cl.
*H03M 13/45* (2006.01)
*H03M 13/11* (2006.01)
*G11C 29/52* (2006.01)

(52) U.S. Cl.
CPC ....... *H03M 13/45* (2013.01); *H03M 13/1125* (2013.01); *G11C 29/52* (2013.01)

(58) Field of Classification Search
None
See application file for complete search history.

(56) References Cited

U.S. PATENT DOCUMENTS

| | | | | |
|---|---|---|---|---|
| 7,975,192 B2* | 7/2011 | Sommer | ............. | G11C 11/5642 714/719 |
| 2010/0034018 A1* | 2/2010 | Yang | ................... | G11C 16/34 365/185.09 |
| 2010/0306150 A1* | 12/2010 | Reynolds | ................. | G06N 7/01 706/46 |
| 2011/0209031 A1* | 8/2011 | Kim | .................... | G11C 11/5642 714/763 |
| 2014/0040704 A1* | 2/2014 | Wu | ........................ | G11C 29/52 714/E11.03 |
| 2015/0131376 A1* | 5/2015 | Tsang | .................. | G11C 16/3404 365/185.24 |
| 2018/0046373 A1* | 2/2018 | Xiong | ................... | G06F 3/0679 |
| 2019/0286522 A1* | 9/2019 | Bhatia | ................. | G06F 11/1076 |
| 2021/0265005 A1* | 8/2021 | Kim | ....................... | G11C 29/42 |

* cited by examiner

*Primary Examiner* — Steve N Nguyen
(74) *Attorney, Agent, or Firm* — IPro, PLLC

(57) ABSTRACT

Systems and methods are provided for estimating LLR values used for soft decoding of data stored in non-volatile storage devices. A method may include reading data stored in a non-volatile storage device using a group of soft read reference voltages, decoding the data read from the non-volatile storage device in a soft decoding process, obtaining a number of ones and a number of zeros for each zone of a plurality of zones delineated by the group of soft read reference voltages and obtaining a log-likelihood ratios (LLR) for each zone of the plurality of zones based on a ratio of the number of ones to the number of zeros in each zone.

23 Claims, 5 Drawing Sheets

SOFT DECODING CORRECTABLE PAGE ASSISTED LLR ESTIMATION

TECHNICAL FIELD

The disclosure herein relates to LLR used for soft decoding, particularly relates to estimating LLR values for soft decoding correctable pages.

BACKGROUND

The evolution of the modern computing system is driven in-part by the emergence of the Solid State Drives (SSDs) that have demonstrated higher performance of speed and latency over the traditional hard drives. Unlike hard drives that depend on the magnetism to store data, solid state drives use non-volatile memory (e.g., NAND or NOR) devices to achieve data storage. The non-volatile memory devices are a family of integrated circuits that are manufactured by advanced processes and assembly technologies to achieve multiple levels of vertical stacking of storages units into a small footprint of die and package for high capacity of storage.

Soft decoding plays a key role in the error recovery procedure of SSD drives. Error correction performance of soft decoding relies on log-likehood ratio (LLR) values. An LLR indicates how much more likely a bit in a voltage range is 0 than 1. Accurate LLRs help attain better error correction performance and faster convergence speed for soft decoding. As working condition of non-volatile memories changes, cell voltage distribution changes as well. LLR values need to be changed accordingly. Conventionally, a pre-defined LLR table is used to provide LLR values for decoding. This pre-defined LLR table, however, cannot provide an accurate LLR values of a time-varying non-volatile storage device. Accordingly, there is a need in the art to provide more accurate estimation of LLR values.

SUMMARY

The present disclosure provides a system and method for adaptively estimating the LLR values by making use of decoding results from successful soft decoding operations. In an exemplary embodiment, there is provided a method that may comprise reading data stored in a non-volatile storage device using a group of soft read reference voltages, decoding the data read from the non-volatile storage device in a soft decoding process, obtaining a number of ones and a number of zeros for each zone of a plurality of zones delineated by the group of soft read reference voltages and obtaining a log-likelihood ratios (LLR) for each zone of the plurality of zones based on a ratio of the number of ones to the number of zeros in each zone.

In another exemplary embodiment, there is provided a storage system controller. The storage system controller may comprise a non-volatile storage device, an error correction code (ECC) engine comprising a decoder; and a processor. The processor may be configured to: issue a command to read data stored in the non-volatile storage device using a group of soft read reference voltages, obtain a number of ones and a number of zeros for each zone of a plurality of zones delineated by the group of soft read reference voltages after the decoder decodes the data read from the non-volatile storage device in a soft decoding process and obtain a log-likelihood ratios (LLR) for each zone of the plurality of zones based on a ratio of the number of ones to the number of zeros in each zone.

In yet another exemplary embodiment, there is provided one or more non-transitory machine-readable media encoded with computer executable instructions. The computer instructions when executed by a storage controller, may cause at least one processor to perform actions comprising: reading data stored in a non-volatile storage device using a group of soft read reference voltages, decoding the data read from the non-volatile storage device in a soft decoding process, obtaining a number of ones and a number of zeros for each zone of a plurality of zones delineated by the group of soft read reference voltages and obtaining a log-likelihood ratios (LLR) for each zone of the plurality of zones based on a ratio of the number of ones to the number of zeros in each zone.

DETAILED DESCRIPTION

Figure 1:
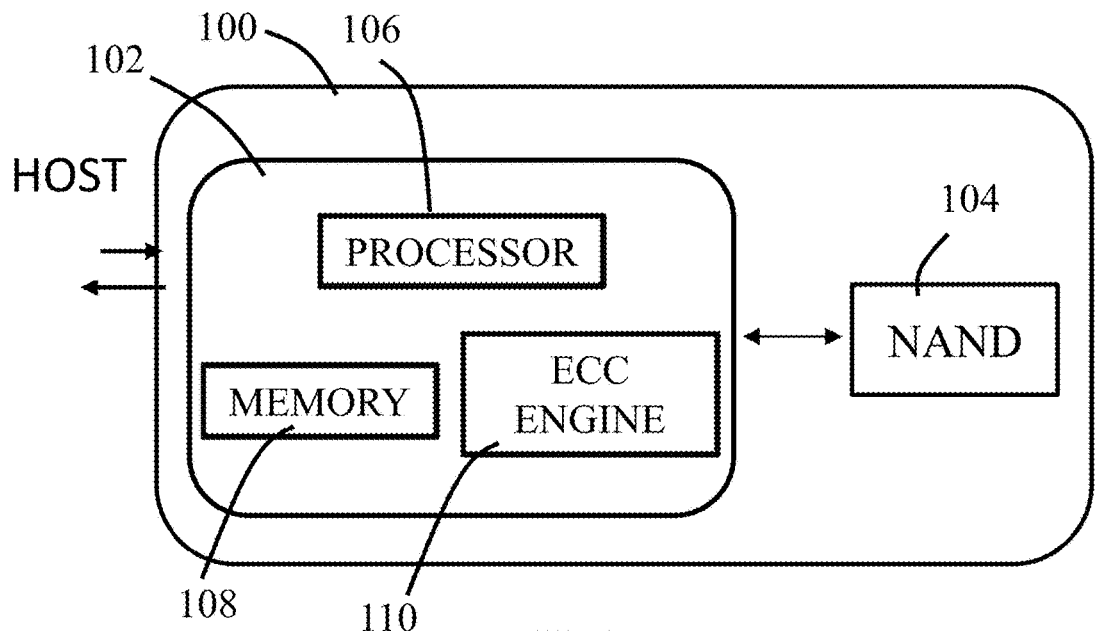
FIG. 1 schematically shows a non-volatile storage system in accordance with an embodiment of the present disclosure.

Specific embodiments according to the present disclosure will now be described in detail with reference to the accompanying figures. Like elements in the various figures are denoted by like reference numerals for consistency.

The present disclosure provides apparatuses, systems and methods for estimating LLRs to be used for decoding data stored in non-volatile memory (NVM) storage devices that are encoded with an error-correcting code (ECC) (e.g., Turbo, Low-Density Parity-Check (LDPC), and Polar, etc.). FIG. 1 schematically shows a non-volatile storage system 100 in accordance with an embodiment of the present disclosure. The non-volatile storage system 100 may comprise a non-volatile storage controller 102 and a non-volatile storage device 104. The non-volatile storage system 100 may provide data storage and/or access to stored data for a host when it is coupled to the host. The non-volatile storage device 104 may be a non-volatile memory (NVM) based storage device, for example, a NAND device. It should be noted that the non-volatile storage system 100 may comprise a plurality of non-volatile storage devices and the non-volatile storage device 104 may be shown as a representative for the plurality of non-volatile storage devices.

The non-volatile storage controller 102 may comprise a processor 106, a memory 108 and an ECC engine 110. The processor 106 may be a computer processor, such as, but not limited to, a microprocessor or a microcontroller. The memory 108 may be a non-transitory computer-readable storage media, such as, DRAM or SRAM, to store computer executable instructions to be executed by the processor 106. The ECC engine 110 may comprise one or more ECC encoders and also may comprise one or more ECC decoders. The one or more ECC encoders may generate encoded data based on input data to be stored and the encoded data may be stored in the non-volatile storage device 104 in a write (program) operation. The one or more ECC decoders may decode the encoded data retrieved from the non-volatile storage device 104 in read operations and correct errors in the data retrieved from the non-volatile storage device 104.

Data stored in the non-volatile storage device 104 may be read by hard read operations or soft read operations. In hard read operations, a hard decision threshold voltage may be used to determine a bit value out of two adjacent states (e.g., logic one and logic zero). In soft read operations, a group of soft read reference voltages may be used to determine a bit value out of two adjacent states. In addition to bit values, soft read operations may also provide reliability information of the bit values, which may be presented as log-likehood ratio (LLR) values. An LLR may indicate how much more likely a bit in a voltage range may be one logic state (e.g., 0) instead of another logic state (e.g., 1). The soft read operations may be used when hard read operations fails. The ECC engine 100 may comprise at least one decoder configured to perform soft decoding based on the data and reliability information obtained by soft read operations.

In some embodiments, encoded data may be scrambled before being written to the non-volatile storage device 104. The scrambling process may be a randomization process, which may be used, for example, to try to make number of 1s and number of 0s to be evenly distributed. In such embodiments, data retrieved from the non-volatile storage device 104 may be de-scrambled first and de-scrambled data may be sent to the decoder of the ECC engine for decoding. The decoding result data may be the original data to be stored but the bit values written to the non-volatile storage device 104 may be scrambled. Therefore, in such embodiments, to get the bit values for the bits written to the non-volatile storage device 104, the decoded data may be scrambled using the same scrambling process.

Figure 2:
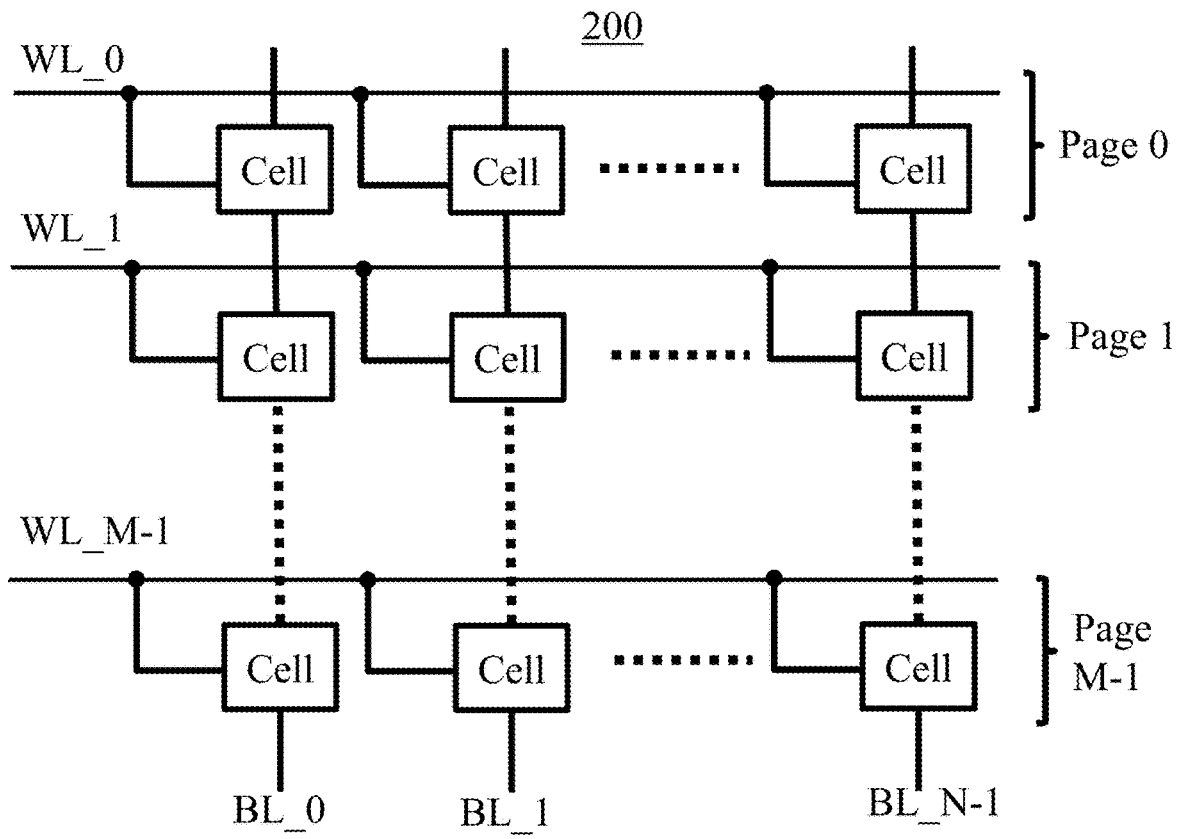
FIG. 2 schematically shows a block of cells in a non-volatile storage device in accordance with an embodiment of the present disclosure.

FIG. 2 schematically shows a block 200 of cells in a non-volatile storage device in accordance with an embodiment of the present disclosure. The non-volatile storage device 104 may comprise one or more dies. Each die may comprise one or more planes and each plane may comprise a plurality of blocks. The block 200 may comprise a plurality of cells organized in a two-dimensional array. The cells in each row may be coupled to one wordline (WL) and referred to as one page (e.g., a physical page). For example, cells of page 0 may have their respective control gates coupled to WL_0, cells of page 1 may have their respective control gates coupled to WL_1, and so on and so forth, until cells of page M−1 may have their respective control gates coupled to WL_M−1. In the column direction, cells may be coupled in series to a bitline (BL), for example, cells in the first column may be chained in series and coupled to BL_0, cells in the second column may be chained in series and coupled to BL_1, and so on and so forth, until cells in the Nth column may be chained in series and coupled to BL_N−1. It should be noted that the physical layout of the cells in a block may be different from the two-dimensional array shown in FIG. 2. But regardless of the physical layout structure, all cells of one physical page share one common wordline.

In one embodiment, the cells in the non-volatile storage device 104 may be a single-level cell (SLC) that may store a one-bit value. In another embodiment, the cells in the non-volatile storage device 104 may be a multi-level cell (MLC) that may store a two-bit value. The two-bit value may be represented as a tuple (LSB, MSB), where LSB is the least significant bit and MSB is the most significant bit. The LSBs stored in a wordline may form the LSB page and the MSBs stored in the wordline may form the MSB page. The LSB page and MSB page for an MLC non-volatile storage device may be referred to as logical pages.

In yet another embodiment, the cells in the non-volatile storage device 104 may be a triple-level cell (TLC) that may store a three-bit value. The three-bit value may be represented as a tuple (LSB, CSB, MSB), where LSB is the least significant bit, CSB is the center significant bit and MSB is the most significant bit. The LSBs stored in a wordline may form the LSB page, CSBs stored in the wordline may form the CSB page and the MSBs stored in the wordline may form the MSB page. The LSB page, CSB page and MSB page for a TLC non-volatile storage device may also be referred to as logical pages. In yet other embodiments, the cells in the non-volatile storage device 104 may store other bit values (e.g., quad-level cell (QLC) for four-bit values), and the cells along one wordline may form more than three logical pages.

The values stored in the cells may be read by measuring the threshold voltages of the cells. The threshold voltage may be the minimal voltage that needs to be applied to the control gate (e.g., a transistor) of a cell to cause the gate to open (e.g., conduct). The read threshold voltage may be indicative of the charge stored in the cell. For cells storing one-bit values (e.g., SLC), each cell may be programmed in one of two states and data stored in the cells of one physical page may be read by applying one hard decision threshold voltage for a hard decision read and a group of read reference voltages to the wordline for a soft read.

For cells storing multi-bit values (e.g., MLC or TLC), each cell may be programmed in one of more than two states (e.g., 4 states for MLC, 8 states for TLC). Different logical pages of these cells may be read by different number of hard decision threshold voltages in hard decision reads and different number of groups of soft read reference voltages in soft reads. For example, the LSB page of MLC cells may need one hard decision threshold voltage for a hard decision read, and one group of soft decision read reference voltages for a soft read. The MSB page of MLC cells may need two hard decision threshold voltages for a hard decision read, and two groups of soft decision read reference voltages for a soft read. Moreover, the LSB page of TLC cells may need one hard decision threshold voltage for a hard decision read, and one group of soft decision read reference voltages for a soft read. The CSB page of TLC cells may need two hard decision threshold voltages for a hard decision read, and two groups of soft decision read reference voltages for a soft read. And the MSB page of TLC cells may need four hard decision threshold voltages for a hard decision read, and four groups of soft decision read reference voltages for a soft read.

Figure 3:
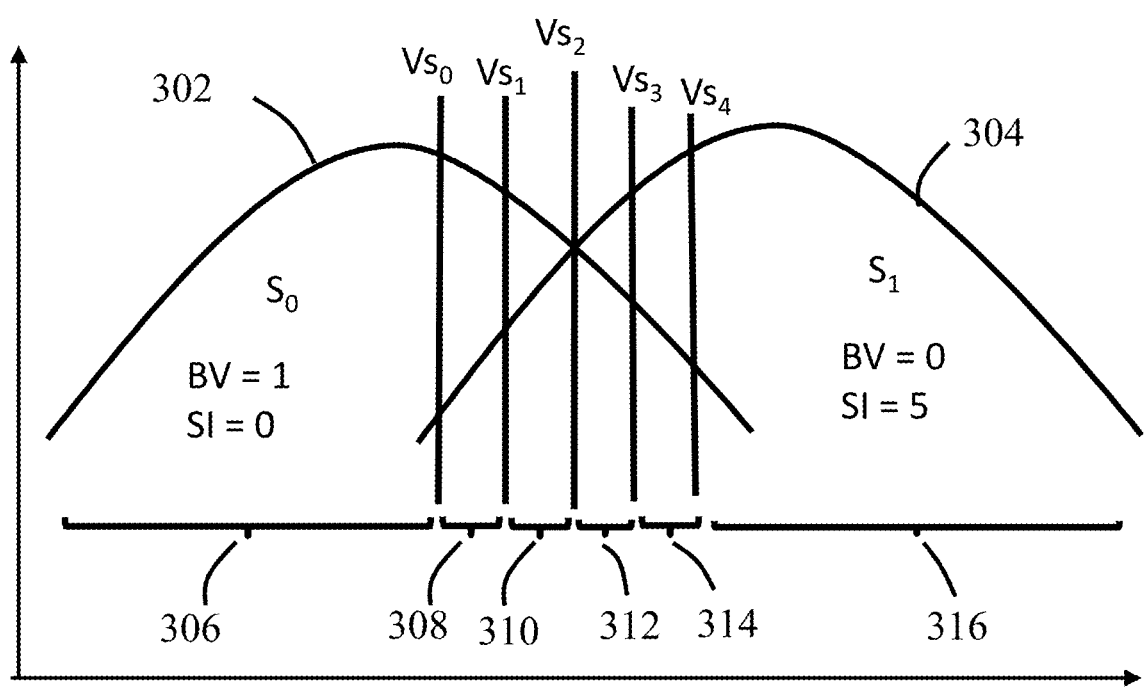
FIG. 3 schematically shows state information of two adjacent states with respect to a group of soft read reference voltages in accordance with an embodiment of the present disclosure.

FIG. 3 schematically shows state information of two adjacent states with respect to a group of soft read reference voltages in accordance with an embodiment of the present disclosure. The horizontal axis in FIG. 3 may be the threshold voltage of storage cells in a SLC storage device. The vertical axis in FIG. 3 may be the probability distribution function of the threshold voltages of storage cells. The curve 302 in FIG. 3 may indicate distribution of cells in a first logic state ($S_0$) with the bit value being logic one (BV=1). The curve 304 in FIG. 3 may indicate distribution of cells in a second logic state ($S_1$) with the bit value being logic zero (BV=0). Data stored in one row of cells may be read in a soft read operation by applying a group of soft read reference voltages to the wordline shared by the cells. The five reference voltages $Vs_0$, $Vs_1$, $Vs_2$, $Vs_3$, and $Vs_4$ may be an example of the group of soft read reference voltages. The state information in FIG. 3 may be collected from the data read in the soft read operation. The first logic state and the second logic state may be two adjacent states distinguished by the group of soft read reference voltages.

As shown in FIG. 3, the group of soft read reference voltages $Vs_0$, $Vs_1$, $Vs_2$, $Vs_3$, and $Vs_4$ may have a plurality of voltage ranges that divide the two states $S_0$ and $S_1$ into a plurality of zones 306, 308, 310, 312, 314 and 316. Each zone may be assigned a unique number, referred to as a soft information (SI) value. For example, zone 306 may be the voltage range of less than the soft read reference voltage $Vs_0$ and assigned a SI value of 0 (e.g., zone SI(0)), Zone 308 may be the voltage range of from $Vs_0$ to $Vs_1$ and assigned a SI value of 1 (e.g., zone SI(1)), Zone 310 may be the voltage range of from $Vs_1$ to $Vs_2$ and assigned a SI value of 2 (e.g., zone SI(2)), Zone 312 may be the voltage range of from $Vs_2$ to $Vs_3$ and assigned a SI value of 3 (e.g., zone SI(3)), Zone 314 may be the voltage range of from $Vs_3$ to $Vs_4$ and assigned a SI value of 4 (e.g., zone SI(4)), Zone 316 may be the voltage range of greater than $Vs_4$ and assigned a SI of 5 (e.g., zone SI(5)). Each voltage of the group of soft read reference voltages $Vs_0$, $Vs_1$, $Vs_2$, $Vs_3$, and $Vs_4$ may be a boundary between two adjacent SI zones. In some embodiments, each boundary may be inclusive for only one voltage range. For example, Zone 310 may be the voltage range of greater than or equal to $Vs_1$ and less than $Vs_2$; alternatively, Zone 310 may be the voltage range of greater than $Vs_1$ and less than or equal to $Vs_2$. In various embodiments, a boundary may be included in either zones as long as all boundaries for one group of soft read reference voltages may be included the same way.

The curve 302 and curve 304 may overlap. In the overlapped area, the bit value read from a non-volatile storage device (e.g., the non-volatile storage device 104) may be flipped by a decoding operation. That is, although a logic state obtained by applying the soft read reference voltage is the first logic state ($S_0$), there is a chance that the correct logic state should have been the second logic state ($S_1$). Also, although a logic state obtained by applying the soft read reference voltage is the second logic state ($S_1$), there is a chance that the correct logic state should have been the first logic state ($S_0$).

During a decoding process, the incorrectly labeled bits may be corrected. That is, during a decoding process by the decoder in the ECC engine 110, the bits that may be incorrectly labeled as logic state one may be flipped to logic state two and bits that may be incorrectly labeled as logic state two may be flipped to logic state one. The bit values obtained by applying the group of soft read reference voltages may be decoded in a soft decoding process. At the end of a successful soft decoding process, each bit may be given a hard decision of whether it should be the logic one or logic zero.

For a random data pattern, cells of a wordline may be evenly distributed among all states. A wordline may be referred to as a correctable wordline when all errors in any cell states (e.g., all logical pages) of the wordline can be corrected. In one embodiment, pre-decoding cell state information for all cells of a wordline may be collected by a soft read operation for the data stored in all cells of the wordline (e.g., obtaining all logical pages). The pre-decoding cell state information may include number of cells in logic one (e.g., pre-decoding number of 1s) in each zone and number of cells in logic zero (e.g., pre-decoding number of 0s) in each zone.

A decoder of the ECC engine 110 may perform a soft decoding operation on the bit values of cells of a wordline and correct any cell states incorrectly labeled. After successfully decoding a page of data, the correct bit values of the cells of the page may be obtained. Based on the voltage ranges delineated by the group of soft read reference voltages, post-decoding number of 1s of each zone and post-decoding number of 0s of each zone may be determined. To simplify wording, unless explicitly referred to as pre-decoding number of 1s or pre-decoding number of zeros, number of 1s and number of zeros may refer to post-decoding number of 1s and post-decoding number of zeros.

It should be noted that if the data written to the storage device is scrambled, then the data read from the storage device may need to be de-scrambled before being sent to the decoder, and the decoding result data may be need to be scrambled using the same scrambling process. That is, the post-decoding number of 1s and post-decoding number of 0s are obtained from the scrambling process result of hard decision bit values obtained from the soft decoding process.

As an example, the number of 1s in zone 306 may be denoted as C(1,0) with the first index in the parenthesis indicating the state being logic one and the second index in the parenthesis indicating the SI value being 0 (e.g., zone 306; also, the number of 0s in zone 306 may be denoted as C(0,0) with the first index in the parenthesis indicating the state being logic zero and the second index in the parenthesis indicating the SI value being 0 (e.g., zone 306). Using this notation, C(1,1) may be the number of 1s for zone 308 and C(0,1) may be the number of 0s for zone 308, C(1,2) may be the number of 1s for zone 310 and C(0,2) may be the number of 0s for zone 310, C(1,3) may be the number of 1s for zone 312 and C(0,3) may be the number of 0s for zone 312, C(1,4) may be the number of 1s for zone 314 and C(0,4) may be the number of 0s for zone 314, and C(1,5) may be the number of 1s for zone 316 and C(0,5) may be the number of 0s for zone 316. The calculation of C(i,j) may be based on a page (e.g., a physical page of SLC, or a logical page of MLC, TLC, etc.), a group of pages, a block, or a group of blocks.

In various embodiments, for each zone, an LLR value may be calculated based on a logarithm of the ratio of the number of 1s to the number of 0s. In one example, $LLR(j) = \log_b(C(0,j)/C(1,j))$, in which the logarithm base b may be any positive integer. In another example, $LLR(j) = \log_b(C(1,j)/C(0,j))$. Or in yet another example, $LLR(j) = \log_b(C(0,j)/C(1,j)) + \text{sign}(\log_b(C(0,j)/C(1,j))) * \text{offset}$, in which sign( ) may return 1 if the input value is positive or −1 if the input value is negative, and offset may be a pre-defined coefficient. Or in a further example, $LLR(j) = (|\log_b(C(0,j)/C(1,j))| > THR) ? \text{sign}(\log_b(C(0,j)/C(1,j))) * THR : \log_b(C(0,j)/C(1,j))$, in which "?:" may be the ternary operator, and THR may be a threshold value. That is, if the absolute values of $\log_b(C(0,j)/C(1,j))$ is greater than the threshold value THR, LLR(j) may be set to the positive THR or negative THR depending the sign of $\log_b(C(0,j)/C(1,j))$, otherwise LLR(j) may be set to $\log_b(C(0,j)/C(1,j))$. In some embodiments, the coefficient offset and the threshold value THR may be obtained by experiments. For example, in a controlled environment such as in a lab, many tests may be performed and data may be collected, various values for offset and THR may be tried and appropriate values may be selected.

Figure 4A:
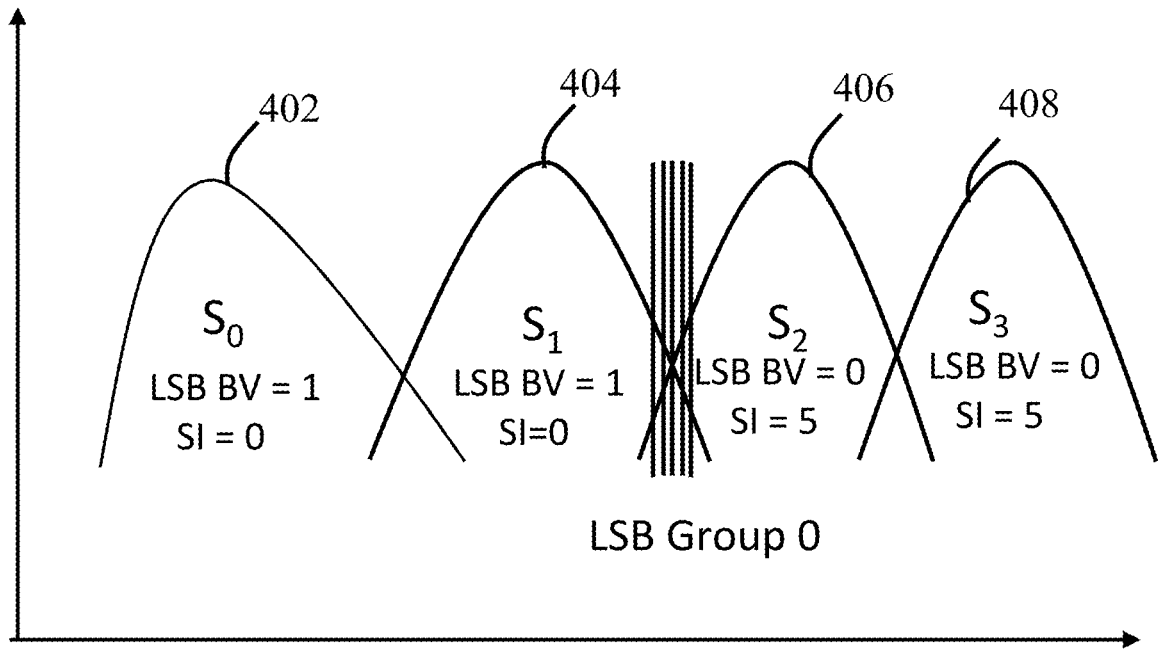
FIG. 4A and FIG. 4B schematically show state information of MLC cells with respect to groups of soft read reference voltages in accordance with an embodiment of the present disclosure.
Figure 4B:
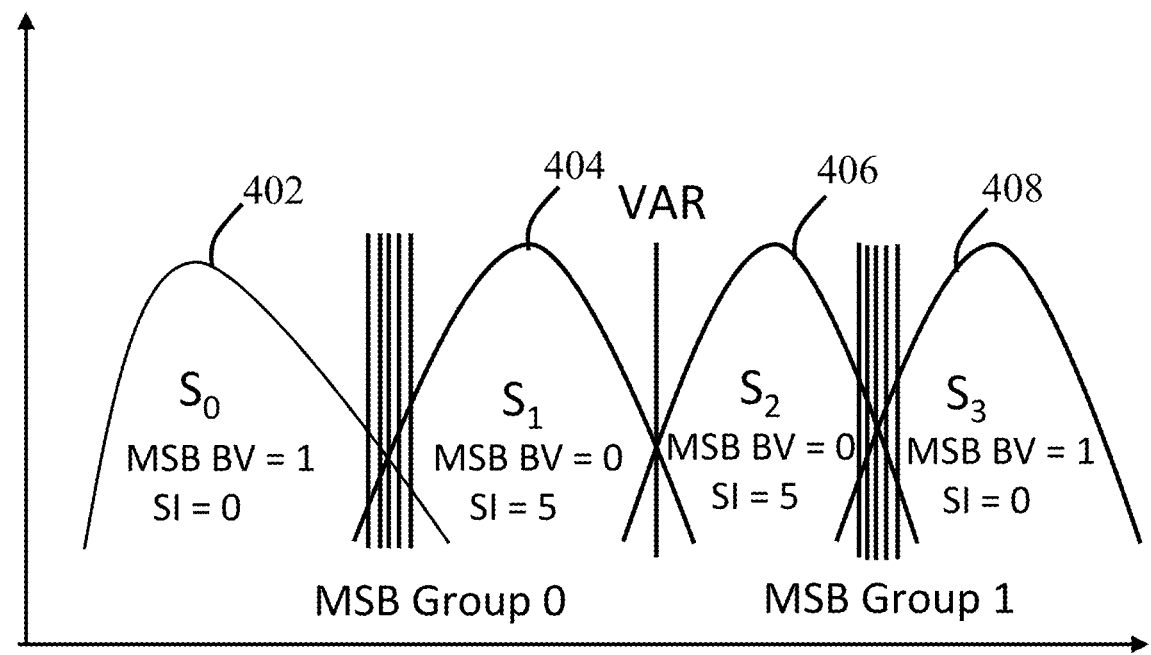

FIGS. 4A and 4B schematically show state information of MLC cells with respect to groups of soft read reference voltages in accordance with an embodiment of the present disclosure. Data stored in MLC cells may contain two-bits of information in four states. The curve 402 may indicate distribution of cells in a first logic state ($S_0$), the curve 404 may indicate distribution of cells in a second logic state ($S_1$), the curve 406 may indicate distribution of cells in a third logic state ($S_2$), the curve 408 may indicate distribution of cells in a fourth logic state ($S_3$). As shown in FIG. 4A, an LSB page of MLC cells may need one group of soft read reference voltages (e.g., LSB group 0) positioned around the intersection of the curve 404 and the curve 406 for a soft read operation. The LSB bits may be logic one for curves 402 and 404 (e.g., BV=1), and logic zero for curves 406 and 408 (e.g., BV=0). The SI values for the zones delineated by the soft read reference voltages of LSB group 0 may increase from left to right with the left most zone having SI=0 and the right most zone having SI=5, and zones in between having SI being 1, 2, 3, 4, respectively, just as the zones in FIG. 3.

As shown in FIG. 4B, an MSB page for MLC cells may need two groups of soft read reference voltages for a soft read operation, e.g., MSB group 0 around the intersection of the curves 402 and 404, and MSB group 1 around the intersection of the curves 406 and 408. The MSB bits may be logic one for curves 402 and 408 (e.g., BV=1), and logic zero for curves 404 and 406 (e.g., BV=0). The soft information values for zones delineated by the soft read reference voltages of MSB group 0 may increase from left to right with the left most zone having SI=0 (e.g., zone SI(0)) and the right most zone having SI=5 (e.g., zone SI(5)), and zones in between having SI being 1, 2, 3, 4, respectively, just as the zones in FIG. 3. The soft information values for zones delineated by the soft read reference voltages of CSB group 1 may decrease from left to right with the left most zone having SI=5 (e.g., zone SI(5)) and the right most zone having SI=0 (e.g., zone SI(0)), and zones in between having SI being 4, 3, 2, 1, respectively.

Although the soft information values for zones delineated by the soft read reference voltages of some groups (e.g., MSB group 1) may decrease from left to right, number of 1s and number of zeros in each zone may be obtained the same as in the situation of FIG. 3 and calculation of LLR(j) is also the same as in the situation of FIG. 3.

In some embodiments, the pre-decoding state information returned by the non-volatile storage device 104 for a soft read operation may include bit values, total numbers of 1s from two zones of the same SI values for each SI value and total numbers of zeros from two zones of the same SI value for each SI value. That is, the number of 1s associated with an SI value of j is a sum of the number of 1s in zone SI(j)) of MSB group 0 and number of 1s in zone SI(j) of MSB group 1. For example, a bit value of 1 in a zone of SI value being 0 may be in state $S_0$ (e.g., curve 402) or in state $S_3$ (e.g., curve 408). Therefore, in some embodiments, an additional read using a hard decision threshold voltage VAR may be performed in addition to the soft read operation. The controller 102 may obtain further information from the additional read and determine whether a cell's threshold voltage is less than VAR so that the corresponding post-decoding bit value may be counted for the zones delineated by group 0, or greater than VAR so that the corresponding post-decoding bit value may be counted for the zone delineated by group 1.

Figure 5A:
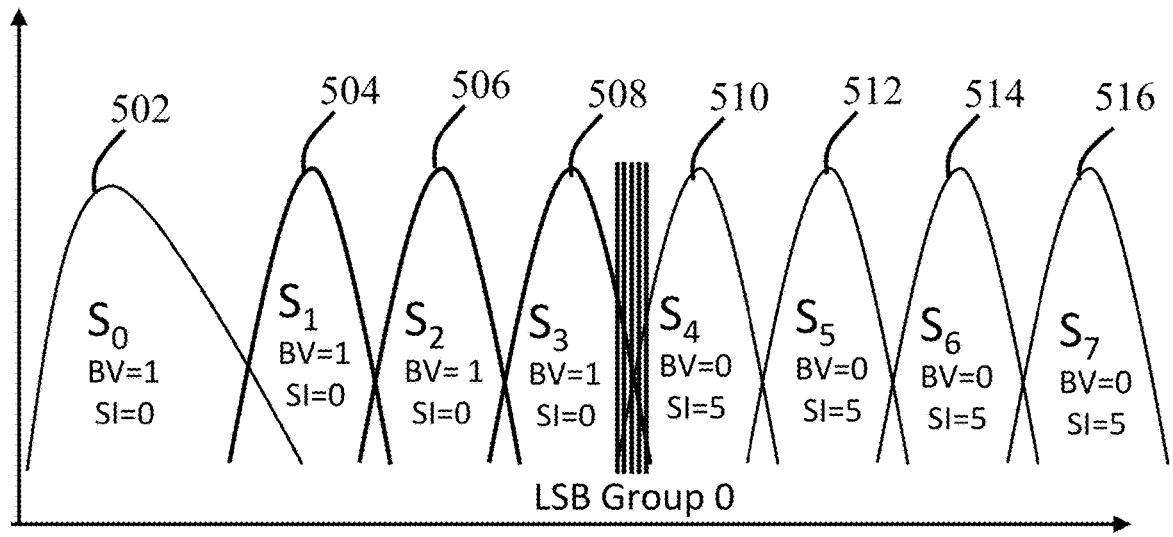
FIG. 5A, FIG. 5B and FIG. 5C schematically show state information of TLC cells with respect to groups of soft read reference voltages in accordance with an embodiment of the present disclosure.
Figure 5B:
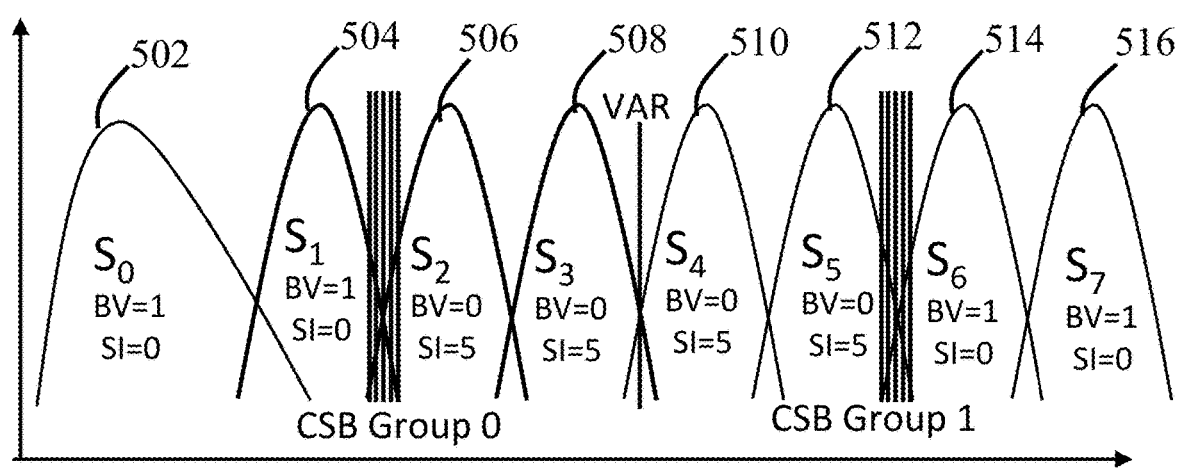
Figure 5C:
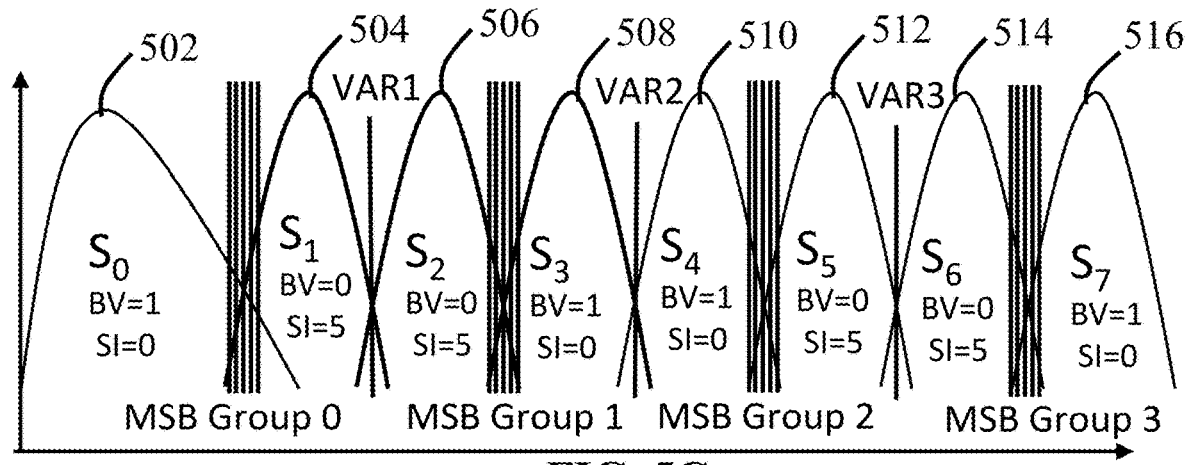

FIG. 5A, FIG. 5B and FIG. 5C schematically show state information of TLC cells with respect to groups of soft read reference voltages in accordance with an embodiment of the present disclosure. Data stored in TLC cells may contain 3-bits of information in eight states. The curve 502 may indicate distribution of cells in a first logic state ($S_0$), the curve 504 may indicate distribution of cells in a second logic state ($S_1$), the curve 506 may indicate distribution of cells in a third logic state ($S_2$), the curve 508 may indicate distribution of cells in a fourth logic state ($S_3$), the curve 510 may indicate distribution of cells in a fifth logic state ($S_4$), the curve 512 may indicate distribution of cells in a sixth logic state ($S_5$), the curve 514 may indicate distribution of cells in a seventh logic state ($S_6$), the curve 516 may indicate distribution of cells in an eighth logic state ($S_7$). As shown in FIG. 5A, an LSB page of TLC cells may need one group of soft read reference voltages (e.g., LSB group 0) positioned around the intersection of the curve 508 and the curve 510 for a soft read operation. The LSB bits may be logic one for curves 502, 504, 506 and 508 (e.g., BV=1), and logic zero for curves 510, 512, 514 and 516 (e.g., BV=0). The SI values for the zones delineated by the soft read reference voltages of LSB group 0 may increase from left to right with the left most zone having SI=0 and the right most zone having SI=5, and zones in between having SI being 1, 2, 3, 4, respectively, just as the zones in FIG. 3.

As shown in FIG. 5B, a CSB page for TLC cells may need two groups of soft read reference voltages for a soft read operation, e.g., CSB group 0 around the intersection of the curves 504 and 506, and CSB group 1 around the intersection of the curves 510 and 512. The CSB bits may be logic one for curves 502, 504, 514 and 516 (e.g., BV=1), and logic zero for curves 506, 508, 510 and 512 (e.g., BV=0). The soft information values for zones delineated by the soft read reference voltages of CSB group 0 may increase from left to right with the left most zone having SI=0 (e.g., zone SI(0)) and the right most zone having SI=5 (e.g., zone SI(5)), and zones in between having SI being 1, 2, 3, 4, respectively, just as the zones in FIG. 3. But the soft information values for zones delineated by the soft read reference voltages of CSB group 1 may decrease from left to right with the left most zone having SI=5 (e.g., zone SI(5)) and the right most zone having SI=0 (e.g., zone SI(0)), and zones in between having SI being 4, 3, 2, 1, respectively.

Because the CSB page of the TLC cells need two groups of soft read reference voltages, in some embodiments, an additional read using a hard decision threshold voltage VAR may be performed in addition to the soft read operation. The controller 102 may obtain further information from the additional read and determine whether a cell's threshold voltage is less than VAR so that the corresponding post-decoding bit value may be counted for the zones delineated by CSB group 0, or greater than VAR so that the corresponding post-decoding bit value may be counted for the zone delineated by CSB group 1.

As shown in FIG. 5C, an MSB page for TLC cells may need four groups of soft read reference voltages for a soft read operation, e.g., MSB group 0 around the intersection of the curves 502 and 504, MSB group 1 around the intersection of the curves 506 and 508, MSB group 2 around the intersection of the curves 510 and 512, and MSB group 1 around the intersection of the curves 514 and 516. The MSB bits may be logic one for curves 502, 508, 510 and 516 (e.g., BV=1), and logic zero for curves 504, 406, 512 and 514 (e.g., BV=0). The soft information values for zones delineated by the soft read reference voltages of MSB group 0 and MSB group 2 may increase from left to right, and the soft information values for zones delineated by the soft read reference voltages of MSB group 1 and MSB group 3 may decrease from left to right. Because the MSB page of the TLC cells need four groups of soft read reference voltages, in some embodiments, additional reads using hard decision threshold voltages VAR1, VAR2 and VAR3 may be performed in addition to the soft read operation. The controller 102 may obtain further information from the additional reads and determine a cell's threshold voltage is in a SI zone of delineated by which MSB group.

In general, if a logical page of a multi-bit value cells may need k groups of soft read reference voltages for a soft read operation, additional (k−1) read operations may be needed for different groups of soft read reference voltages. In some embodiments, additional read result is not available. In these embodiments, decoding results from a correctable wordline may be used to distinguish the number of 1s and number 0s from different groups of soft read reference voltages. Even in embodiments that decoding results from a correctable wordline may be used to distinguish between different groups of soft read reference voltages, additional read(s) may still be useful. For example, sometimes, some pages of a wordline may not be available, such as in a random read, there is no guarantee that all pages of a wordline will be read. In embodiments that additional reads may be available, the result of addition reads may be the same as hard reads. In the examples of FIGS. 4B and 5B, the result of VAR read may be the same as a hard read for a LSB read when VAR is used as the hard read Vref for the LSB page. In the example of FIG. 5C, VAR2 may be considered as a hard read for the LSB page, and VAR1 and VAR3 may be considered as a hard read for the CSB page.

Figure 6:
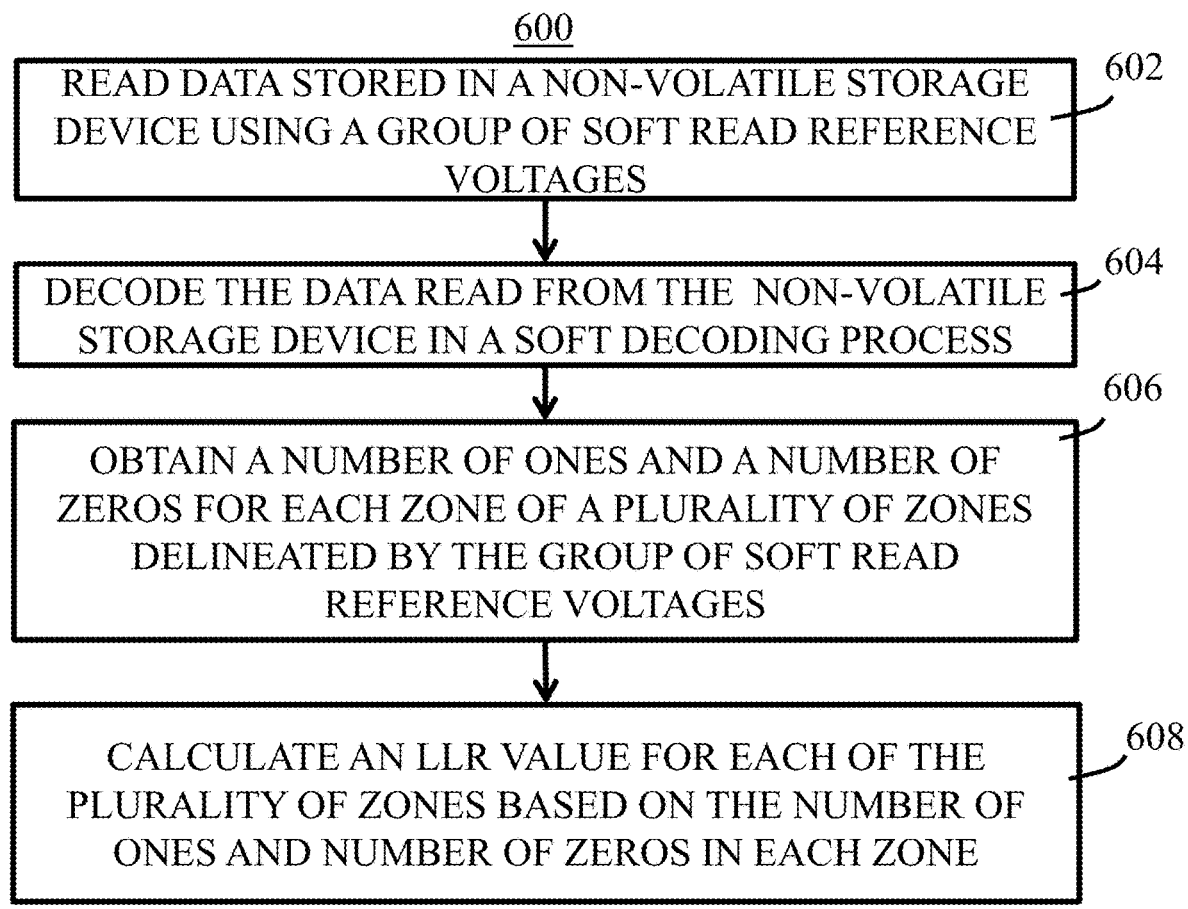
FIG. 6 schematically shows a process for obtaining LLR estimations in accordance with an embodiment of the present disclosure.

FIG. 6 is a flow diagram of a process 600 for estimating LLR values in accordance with an embodiment of the present disclosure. At block 602, data stored in a non-volatile storage device may be read using a group of soft read reference voltages. For example, the controller 102 may send a command to the non-volatile storage device 104 to read data stored in the non-volatile storage device 104. The command may specify that a group of soft read reference voltages (e.g., $Vs_0$, $Vs_1$, $Vs_2$, $Vs_3$, and $Vs_4$ of FIG. 3) may be applied to a wordline to read bit values stored in cells of the wordline. The group of soft read reference voltages may be for reading data of one physical page for SLC or reading data of an LSB page (e.g., MLC or TLC), or the group of soft read reference voltages may be one group of multiple groups for reading data of a logical page that needs multiple groups of soft read reference voltages for one soft read operation (e.g., MSB group 0 or MSB group 1 of MLC).

At block 604, the data read from the non-volatile storage device may be decoded in a soft decoding process. For example, the decoder of the ECC engine 110 may perform a soft decoding operation on the data read from the non-volatile storage device 104. The soft decoding operation may correct any cell bit values incorrectly labeled. In the embodiments that encoded data may be scrambled before being written to the non-volatile storage device, the data read from the non-volatile storage device may be de-scrambled before decoded.

At block 606, a number of ones and a number of zeros may be obtained for each zone of a plurality of zones delineated by the group of soft read reference voltages. The number of ones and number of zeros here may refer to the post-decoding number of ones and post-decoding number of zeros. As an example, as shown in FIG. 3, the groups of soft read reference voltages $Vs_0$, $Vs_1$, $Vs_2$, $Vs_3$, and $Vs_4$ may delineate a plurality of zones (e.g., zones 306, 308, 310, 312, 314 and 316) with each zone having a different soft information value. The controller 102 may obtain number of ones and number of zeros $C(i,j)$ for each zone, with the first index "i" being one or zero and the second index "j" being the soft information value for each zone. In the embodiments that encoded data may be scrambled before being written to the non-volatile storage device, decoding result hard decisions may be scrambled and $C(i,j)$ may be obtained from scrambled hard decisions of the soft decoding result.

At block 608, an LLR value may be calculated for each zone of the plurality of zones. For example, a respective LLR value may be calculated based on a logarithm of the ratios of the number of ones to the number of zeros for each zone.

The process 600 and features of the non-volatile storage system 100 related to estimating LLR values may be implemented using software (e.g., executable by a computer processor (CPU, GPU, or both)), hardware (e.g., a field-programmable gate array (FPGA) or an application-specific IC (ASIC), firmware, or any suitable combination of the three. In one embodiment, for example, the process 600 and features of the non-volatile storage system 100 related to estimating LLR values for each SI values may be programmed in computer processor executable instructions, stored in a non-transitory machine-readable medium (e.g., the memory 108, the non-volatile storage device 104, hard drive, CD, DVD, etc.) and performed by the processor 106 (e.g., a microprocessor or a microcontroller) executing the executable instructions.

Embodiments may use the group of read reference voltage for soft read operations to delineate cell threshold voltage distribution into zones or regions. Bit values of each zone for data stored in the non-volatile storage device may be obtained by processing decoding results.

For NVM cells each storing a one-bit value (e.g., SLC), a group of soft read reference voltages may be used in a soft read operation to read data. The group of soft read reference voltages may divide the state distribution into a plurality of zones corresponding to the voltage ranges, and the LLR values for each zone may be obtained based on the number of ones and number of zeros in each zone. For NVM cells each storing a multi-bit value (e.g., MLC or TLC), one or more groups of read reference voltages may be used in a soft read operation (e.g., one group for LSB of MLC and LSB of TLC, two groups for MSB of MLC and CSB of TLC, and four groups for MSB of TLC), and LLR values for each group of soft read reference voltages may be obtained after one soft read operation. If a page has multiple groups of soft read reference voltages, additional read operations may be needed but not required Moreover, because calculation of the number of ones and number of zeros $C(i,j)$ for each zone may be based on a page (e.g., a physical page of SLC, or a logical page of MLC, TLC, etc.), a group of pages, a block, or a group of blocks, LLR values may be obtained page-wise, group-page-wise, block-wise or group-block-wise.

Furthermore, embodiments may adaptively provide more accurate LLR estimation for soft decoding. Soft decoding may have a better correction performance and a faster convergence speed. And read performance of non-volatile storage system may be improved.

In an exemplary embodiment, there is provided a method that may comprise reading data stored in a non-volatile storage device using a group of soft read reference voltages, decoding the data read from the non-volatile storage device in a soft decoding process, obtaining a number of ones and a number of zeros for each zone of a plurality of zones delineated by the group of soft read reference voltages and obtaining a log-likelihood ratios (LLR) for each zone of the plurality of zones based on a ratio of the number of ones to the number of zeros in each zone.

In one embodiment, $LLR(j)=\log_b(C(0,j)/C(1,j))$ or $LLR(j)=\log_b(C(1,j)/C(0,j))$, in which $LLR(j)$ may be the LLR value for a zone having a soft information value j, b may be a positive integer, $C(0,j)$ may be the number of zeros in the zone having soft information value j and $C(1,j)$ may be the number of ones in the zone having soft information value j.

In one embodiment, $LLR(j)=\log_b(C(0,j)/C(1,j))+\text{sign}(\log_b(C(0,j)/C(1,j)))*\text{offset}$, in which $LLR(j)$ may be the LLR value for a zone having a soft information value j, b may be a positive integer, $C(0,j)$ may be the number of zeros in the zone having soft information value j and $C(1,j)$ may be the number of ones in the zone having soft information value j, sign( ) may be a function that returns 1 if the input value is positive or −1 if the input value is negative, and offset may be a pre-defined coefficient.

In one embodiment, $LLR(j)=(|\log_b(C(0,j)/C(1,j))|>THR)$ $?\text{sign}(\log_b(C(0,j)/C(1,j)))*THR:\log_b(C(0,j)/C(1,j))$, in which $LLR(j)$ may be the LLR value for a zone having a soft information value j, b may be a positive integer, "?:" may be a ternary operator, THR may be a threshold value, $C(0,j)$ may be the number of zeros in the zone having soft information value j and $C(1,j)$ may be the number of ones in the zone having soft information value j.

In one embodiment, the method may further comprise de-scrambling the data read from the non-volatile storage device before decoding the data and scrambling decoded data before obtaining the number of ones and the number of zeros for each zone of the plurality of zones delineated by the group of soft read reference voltages.

In one embodiment, the non-volatile storage device may contain cells that each may be configured to store a multi-bit value, the group of soft read reference voltages may be one of a plurality of groups of soft read reference voltages used in a soft read operation for one logical page, and LLR values may be obtained for the plurality of groups of soft read reference voltages.

In one embodiment, the method may further comprise performing one or more additional reads for the logical page using one or more hard decision threshold voltages.

In another exemplary embodiment, there is provided a storage system controller. The storage system controller may comprise a non-volatile storage device, an error correction code (ECC) engine comprising a decoder; and a processor. The processor may be configured to: issue a command to read data stored in the non-volatile storage device using a group of soft read reference voltages, obtain a number of ones and a number of zeros for each zone of a plurality of zones delineated by the group of soft read reference voltages after the decoder decodes the data read from the non-volatile storage device in a soft decoding process and obtain a log-likelihood ratios (LLR) for each zone of the plurality of zones based on a ratio of the number of ones to the number of zeros in each zone.

In one embodiment, $LLR(j)=\log_b(C(0,j)/C(1,j))$ or $LLR(j)=\log_b(C(1,j)/C(0,j))$, in which $LLR(j)$ may be the LLR value for a zone having a soft information value j, b may be a positive integer, $C(0,j)$ may be the number of zeros in the zone having soft information value j and $C(1,j)$ may be the number of ones in the zone having soft information value j.

In one embodiment, $LLR(j)=\log_b(C(0,j)/C(1,j))+\text{sign}(\log_b(C(0,j)/C(1,j)))*\text{offset}$, in which $LLR(j)$ may be the LLR value for a zone having a soft information value j, b may be a positive integer, $C(0,j)$ may be the number of zeros in the zone of soft information value j and $C(1,j)$ may be the number of ones in the zone having soft information value j, sign( ) may be a function that returns 1 if the input value is positive or −1 if the input value is negative, and offset may be a pre-defined coefficient.

In one embodiment, $LLR(j)=(|\log_b(C(0,j)/C(1,j))|>THR)$ $?\text{sign}(\log_b(C(0,j)/C(1,j)))*THR:\log_b(C(0,j)/C(1,j))$, in which $LLR(j)$ may be the LLR value for a zone having a soft information value j, b may be a positive integer, "?:" may be a ternary operator, THR may be a threshold value, $C(0,j)$ may be the number of zeros in the zone having soft information value j and $C(1,j)$ may be the number of ones in the zone having soft information value j.

In one embodiment, the processor may be further configured to de-scramble the data read from the non-volatile storage device before decoding the data and scramble decoded data before obtaining the number of ones and the number of zeros for each zone of the plurality of zones delineated by the group of soft read reference voltages.

In one embodiment, the non-volatile storage device may contain cells that each may be configured to store a multi-bit value, the group of soft read reference voltages may be one of a plurality of groups of soft read reference voltages used in a soft read operation for one logical page, and LLR values may be obtained for the plurality of groups of soft read reference voltages.

In one embodiment, the processor may be further configured to perform one or more additional reads for the logical page using one or more hard decision threshold voltages.

In yet another exemplary embodiment, there is provided one or more non-transitory machine-readable media encoded with computer executable instructions. The computer instructions when executed by a storage controller, may cause at least one processor to perform actions comprising: reading data stored in a non-volatile storage device using a group of soft read reference voltages, decoding the data read from the non-volatile storage device in a soft decoding process, obtaining a number of ones and a number of zeros for each zone of a plurality of zones delineated by the group of soft read reference voltages and obtaining a log-likelihood ratios (LLR) for each zone of the plurality of zones based on a ratio of the number of ones to the number of zeros in each zone.

In one embodiment, $LLR(j)=\log_b(C(0,j)/C(1,j))$, $LLR(j)=\log_b(C(1,j)/C(0,j))$, or $LLR(j)=\log_b(C(0,j)/C(1,j))+\text{sign}(\log_b(C(0,j)/C(1,j)))*\text{offset}$, in which $LLR(j)$ may be the LLR value for a zone having a soft information value j, b may be a positive integer, $C(0,j)$ may be the number of zeros in the zone having soft information value j and $C(1,j)$ may be the number of ones in the zone having soft information value j, sign( ) may be a function that returns 1 if the input value is positive or −1 if the input value is negative, and offset may be a pre-defined coefficient.

In one embodiment, $LLR(j)=(|\log_b(C(0,j)/C(1,j))|>THR)$ $?\text{sign}(\log_b(C(0,j)/C(1,j)))*THR:\log_b(C(0,j)/C(1,j))$, in which $LLR(j)$ may be the LLR value for a zone having a soft information value j, b may be a positive integer, "?:" may be a ternary operator, THR may be a threshold value, $C(0,j)$ may be the number of zeros in the zone having soft information value j and $C(1,j)$ may be the number of ones in the zone having soft information value j.

In one embodiment, the one or more non-transitory computer readable storage media may be further encoded with computer executable instructions that, when executed, cause the at least one processor to perform further actions comprising: de-scrambling the data read from the non-volatile storage device before decoding the data and scrambling decoded data before obtaining the number of ones and the number of zeros for each zone of the plurality of zones delineated by the group of soft read reference voltages.

In one embodiment, the non-volatile storage device may contain cells that each may be configured to store a multi-bit value, the group of soft read reference voltages may be one of a plurality of groups of soft read reference voltages used in a soft read operation for one logical page, and LLR values may be obtained for the plurality of groups of soft read reference voltages.

In one embodiment, the one or more non-transitory computer readable storage media may be further encoded with computer executable instructions that, when executed, cause the at least one processor to perform further actions comprising: performing one or more additional reads for the logical page using one or more hard decision threshold voltages.

Any of the disclosed methods (e.g., the process 600) and operations may be implemented in software comprising computer-executable instructions stored on one or more computer-readable storage media. The one or more computer-readable storage media may include non-transitory computer-readable media (such as removable or non-removable magnetic disks, magnetic tapes or cassettes, solid state drives (SSDs), hybrid hard drives, CD-ROMs, CD-RWs, DVDs, or any other tangible storage medium), volatile memory components (such as DRAM or SRAM), or non-volatile memory components (such as hard drives)). The computer-executable instructions may be executed on a computer (e.g., any commercially available computer, including smart phones or other mobile devices that include computing hardware) by a computer processor (e.g., a CPU, a GPU, or both). Any of the computer-executable instructions for implementing the disclosed techniques as well as any data created and used during implementation of the disclosed embodiments may be stored on one or more computer-readable media (e.g., non-transitory computer-readable media). Such software can be executed, for example, on a single local computing device (e.g., any suitable commercially available computer or mobile device) or in a network environment (e.g., via the Internet, a wide-area network, a local-area network, a client-server network (such as a cloud computing network), or other such network) using one or more network computers.

Embodiments according to the present disclosure, may be implemented for any types of ECC codes, such as, but not limited to, rectangular parity, Turbo, Low-Density Parity-Check (LDPC), Polar, and Hamming code.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method, comprising:
   reading data stored in a non-volatile storage device using a group of soft read reference voltages;
   decoding the data read from the non-volatile storage device in a soft decoding process;
   obtaining a number of ones and a number of zeros for each zone of a plurality of zones delineated by the group of soft read reference voltages; and
   obtaining a log-likelihood ratios (LLR) for each zone of the plurality of zones based on a ratio of the number of ones to the number of zeros in each zone.

2. The method of claim 1, wherein $LLR(j)=\log_b(C(0,j)/C(1,j))$ or $LLR(j)=\log_b(C(1,j)/C(0,j))$, in which $LLR(j)$ is the LLR value for a zone having a soft information value j, b is a positive integer, $C(0,j)$ is the number of zeros in the zone having soft information value j and $C(1,j)$ is the number of ones in the zone having soft information value j.

3. The method of claim 1, wherein $LLR(j)=\log_b(C(0,j)/C(1,j))+\text{sign}(\log_b(C(0,j)/C(1,j)))*\text{offset}$, in which $LLR(j)$ is the LLR value for a zone having a soft information value j, b is a positive integer, $C(0,j)$ is the number of zeros in the zone having soft information value j and $C(1,j)$ is the number of ones in the zone having soft information value j, sign( ) is a function that returns 1 if the input value is positive or −1 if the input value is negative, and offset is a pre-defined coefficient.

4. The method of claim 1, wherein $LLR(j)=(|\log_b(C(0,j)/C(1,j))|>THR?\text{sign}(\log_b(C(0,j)/C(1,j)))*THR:\log_b(C(0,j)/C(1,j)))$, in which $LLR(j)$ is the LLR value for a zone having a soft information value j, b is a positive integer, "?:" is a ternary operator, THR is a threshold value, $C(0,j)$ is the number of zeros in the zone having soft information value j and $C(1,j)$ is the number of ones in the zone having soft information value j.

5. The method of claim 1, wherein the data read from the non-volatile storage device are scrambled, the method further comprising:
   de-scrambling the data read from the non-volatile storage device to obtain de-scrambled data, wherein decoding the data comprises decoding the de-scrambled data to obtain decoded data; and
   scrambling the decoded data before obtaining the number of ones and the number of zeros for each zone of the plurality of zones delineated by the group of soft read reference voltages.

6. The method of claim 1, wherein the non-volatile storage device contains cells that each is configured to store a multi-bit value, the group of soft read reference voltages are one of a plurality of groups of soft read reference voltages used in a soft read operation for one logical page, and LLR values are obtained for the plurality of groups of soft read reference voltages.

7. The method of claim 6, further comprising performing one or more additional reads for the logical page using one or more hard decision threshold voltages.

8. The method of claim 1, wherein reading the data stored in the non-volatile storage device comprises reading the data from multiple cells of the non-volatile storage device using the group of soft read reference voltages.

9. A storage system controller, comprising:
   a non-volatile storage device;
   an error correction code (ECC) engine comprising a decoder; and
   a processor configured to:
      issue a command to read data stored in the non-volatile storage device using a group of soft read reference voltages;
      obtain a number of ones and a number of zeros for each zone of a plurality of zones delineated by the group of soft read reference voltages after the decoder decodes the data read from the non-volatile storage device in a soft decoding process; and
      obtain a log-likelihood ratios (LLR) for each zone of the plurality of zones based on a ratio of the number of ones to the number of zeros in each zone.

10. The storage system controller of claim 9, wherein $LLR(j)=\log_b(C(0,j)/C(1,j))$ or $LLR(j)=\log_b(C(1,j)/C(0,j))$, in which $LLR(j)$ is the LLR value for a zone having a soft information value j, b is a positive integer, $C(0,j)$ is the number of zeros in the zone having soft information value j and C(1,j) is the number of ones in the zone having soft information value j.

11. The storage system controller of claim 9, wherein $LLR(j)=\log_b(C(0,j)/C(1,j))+\text{sign}(\log_b(C(0,j)/C(1,j)))*\text{offset}$, in which LLR(j) is the LLR value for a zone having a soft information value j, b is a positive integer, C(0,j) is the number of zeros in the zone of soft information value j and C(1,j) is the number of ones in the zone having soft information value j, sign( ) is a function that returns 1 if the input value is positive or −1 if the input value is negative, and offset is a pre-defined coefficient.

12. The storage system controller of claim 9, wherein $LLR(j)=(|\log_b(C(0,1)/C(1,j))|>THR)?\text{sign}(\log_b(C(0,1)/C(1,j)))*THR:\log_b(C(0,j)/C(1,j))$, in which LLR(j) is the LLR value for a zone having a soft information value j, b is a positive integer, "?:" is a ternary operator, THR is a threshold value, C(0,j) is the number of zeros in the zone having soft information value j and C(1,j) is the number of ones in the zone having soft information value j.

13. The storage system controller of claim 9, wherein the data read from the non-volatile storage device are scrambled, wherein the processor is further configured to
de-scramble the data read from the non-volatile storage device to obtain de-scrambled data, wherein that the decoder decodes the data comprises that the decoder decodes the de-scrambled data to obtain decoded data; and
scramble the decoded data before obtaining the number of ones and the number of zeros for each zone of the plurality of zones delineated by the group of soft read reference voltages.

14. The storage system controller of claim 9, wherein the non-volatile storage device contains cells that each is configured to store a multi-bit value, the group of soft read reference voltages are one of a plurality of groups of soft read reference voltages used in a soft read operation for one logical page, and LLR values are obtained for the plurality of groups of soft read reference voltages.

15. The storage system controller of claim 14, wherein the processor is further configured to perform one or more additional reads for the logical page using one or more hard decision threshold voltages.

16. The storage system controller of claim 9, wherein the processor is configured to issue the command to read the data from multiple cells of the non-volatile storage device using the group of soft read reference voltages.

17. One or more non-transitory computer readable storage media encoded with computer executable instructions that, when executed, cause at least one processor to perform actions comprising:
reading data stored in a non-volatile storage device using a group of soft read reference voltages;
decoding the data read from the non-volatile storage device in a soft decoding process;
obtaining a number of ones and a number of zeros for each zone of a plurality of zones delineated by the group of soft read reference voltages; and
obtaining a log-likelihood ratios (LLR) for each zone of the plurality of zones based on a ratio of the number of ones to the number of zeros in each zone.

18. The non-transitory computer readable storage media of claim 17, wherein $LLR(j)=\log_b(C(0,j)/C(1,j))$, $LLR(j)=\log_b(C(1,j)/C(0,j))$, or $LLR(j)=\log_b(C(0,j)/C(1,j))+\text{sign}(\log_b(C(0,j)/C(1,j)))*\text{offset}$, in which LLR(j) is the LLR value for a zone having a soft information value j, b is a positive integer, C(0,j) is the number of zeros in the zone having soft information value j and C(1,j) is the number of ones in the zone having soft information value j, sign( ) is a function that returns 1 if the input value is positive or −1 if the input value is negative, and offset is a pre-defined coefficient.

19. The non-transitory computer readable storage media of claim 17, wherein $LLR(j)=(|\log_b(C(0,j)/C(1,j))|>THR)?\text{sign}(\log_b(C(0,j)/C(1,j)))*THR:\log_b(C(0,j)/C(1,j))$, in which LLR(j) is the LLR value for a zone having a soft information value j, b is a positive integer, "?:" is a ternary operator, THR is a threshold value, C(0,j) is the number of zeros in the zone having soft information value j and C(1,j) is the number of ones in the zone having soft information value j.

20. The non-transitory computer readable storage media of claim 17, wherein the data read from the non-volatile storage device are scrambled and wherein the non-transitory computer readable storage media are further encoded with computer executable instructions that, when executed, cause the at least one processor to perform further actions comprising:
de-scrambling the data read from the non-volatile storage device to obtain de-scrambled data, wherein decoding the data comprises decoding the de-scrambled data to obtain decoded data; and
scrambling the decoded data before obtaining the number of ones and the number of zeros for each zone of the plurality of zones delineated by the group of soft read reference voltages.

21. The non-transitory computer readable storage media of claim 17, wherein the non-volatile storage device contains cells that each is configured to store a multi-bit value, the group of soft read reference voltages are one of a plurality of groups of soft read reference voltages used in a soft read operation for one logical page, and LLR values are obtained for the plurality of groups of soft read reference voltages.

22. The non-transitory computer readable storage media of claim 21, further encoded with computer executable instructions that, when executed, cause the at least one processor to perform further actions comprising: performing one or more additional reads for the logical page using one or more hard decision threshold voltages.

23. The non-transitory computer readable storage media of claim 17, wherein reading the data stored in the non-volatile storage device comprises reading the data from multiple cells of the non-volatile storage device using the group of soft read reference voltages.

* * * * *